US009659988B2

(12) United States Patent
Soda et al.

(10) Patent No.: US 9,659,988 B2
(45) Date of Patent: May 23, 2017

(54) IMAGE PICKUP APPARATUS

(71) Applicant: CANON KABUSHIKI KAISHA, Tokyo (JP)

(72) Inventors: Takehiko Soda, Yokohama (JP); Masahiro Kobayashi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/085,780

(22) Filed: Mar. 30, 2016

(65) Prior Publication Data
US 2016/0293662 A1 Oct. 6, 2016

(30) Foreign Application Priority Data

Apr. 2, 2015 (JP) .................. 2015-076378

(51) Int. Cl.
H01L 27/146 (2006.01)
(52) U.S. Cl.
CPC .... *H01L 27/1463* (2013.01); *H01L 27/14634* (2013.01); *H01L 27/14636* (2013.01); *H01L 27/14641* (2013.01); *H01L 27/14643* (2013.01)
(58) Field of Classification Search
CPC .................. H01L 27/146; H01L 27/14831
See application file for complete search history.

(56) References Cited

U.S. PATENT DOCUMENTS

2014/0151532 A1* 6/2014 Ito ............... H04N 5/37452
250/208.1

FOREIGN PATENT DOCUMENTS

JP    2014-216536 A    11/2014

* cited by examiner

Primary Examiner — Marc Armand
(74) Attorney, Agent, or Firm — Canon USA, Inc IP Division

(57) ABSTRACT

In an image pickup apparatus, during a period from a start of an accumulation period of electric carriers to an end of a reading period for a first photoelectric conversion unit and a second photoelectric conversion unit, the number of times an on-state voltage is supplied to a gate electrode of a first transfer transistor is larger than the number of times an on-state voltage is supplied to a gate electrode of a second transfer transistor. Additionally, among a plurality of pixels, in a pixel having a shortest distance from the gate electrode of the second transfer transistor to a contact plug, a distance from the gate electrode of the second transfer transistor to the contact plug is shorter than a distance from the gate electrode of the first transfer transistor to the contact plug.

20 Claims, 15 Drawing Sheets

IMAGE PICKUP APPARATUS

BACKGROUND OF THE INVENTION

1. Field of the Invention

The present invention relates to an image pickup apparatus. Particularly, the invention relates to an image pickup apparatus having a contact plug that supplies a reference voltage to a semiconductor region serving as a channel region for transfer transistors.

2. Description of the Related Art

In the past, a configuration that enables both of focus detection and imaging on an image pickup area has been proposed for an image pickup apparatus used in a digital camcorder, a digital still camera, or the like.

Japanese Patent Application Laid-Open No. 2014-216536 discloses a configuration in which each pixel has two photoelectric conversion units. Additionally, each pixel includes a first transfer transistor and a second transfer transistor each corresponding to one of the photoelectric conversion units and floating diffusions each corresponding to one of the photoelectric conversion units.

SUMMARY OF THE INVENTION

An image pickup apparatus according to the invention includes a plurality of pixels each having a first photoelectric conversion unit and a second photoelectric conversion unit, a floating diffusion configured to accumulate electric carriers generated in the first photoelectric conversion unit and the second photoelectric conversion unit, a first transfer transistor configured to transfer electric carriers from the first photoelectric conversion unit to the floating diffusion, a second transfer transistor configured to transfer electric carriers from the second photoelectric conversion unit to the floating diffusion, and an amplification transistor configured to amplify signals based on the electric carriers accumulated in the floating diffusion; and a contact plug configured to supply a reference voltage to a semiconductor region serving as a channel region for the first transfer transistor, the second transfer transistor, and the amplification transistor. In the image pickup apparatus, during a period from a start of an accumulation period of electric carriers to an end of a reading period for the first photoelectric conversion unit and the second photoelectric conversion unit, the number of times an on-state voltage is supplied to a gate electrode of the first transfer transistor is larger than the number of times an on-state voltage is supplied to a gate electrode of the second transfer transistor. Additionally, among the plurality of pixels, in a pixel having a shortest distance from the gate electrode of the second transfer transistor to the contact plug, a distance from the gate electrode of the second transfer transistor to the contact plug is shorter than a distance from the gate electrode of the first transfer transistor to the contact plug.

Further features of the present invention will become apparent from the following description of exemplary embodiments (with reference to the attached drawings).

DESCRIPTION OF THE EMBODIMENTS

First Embodiment

Figure 1:
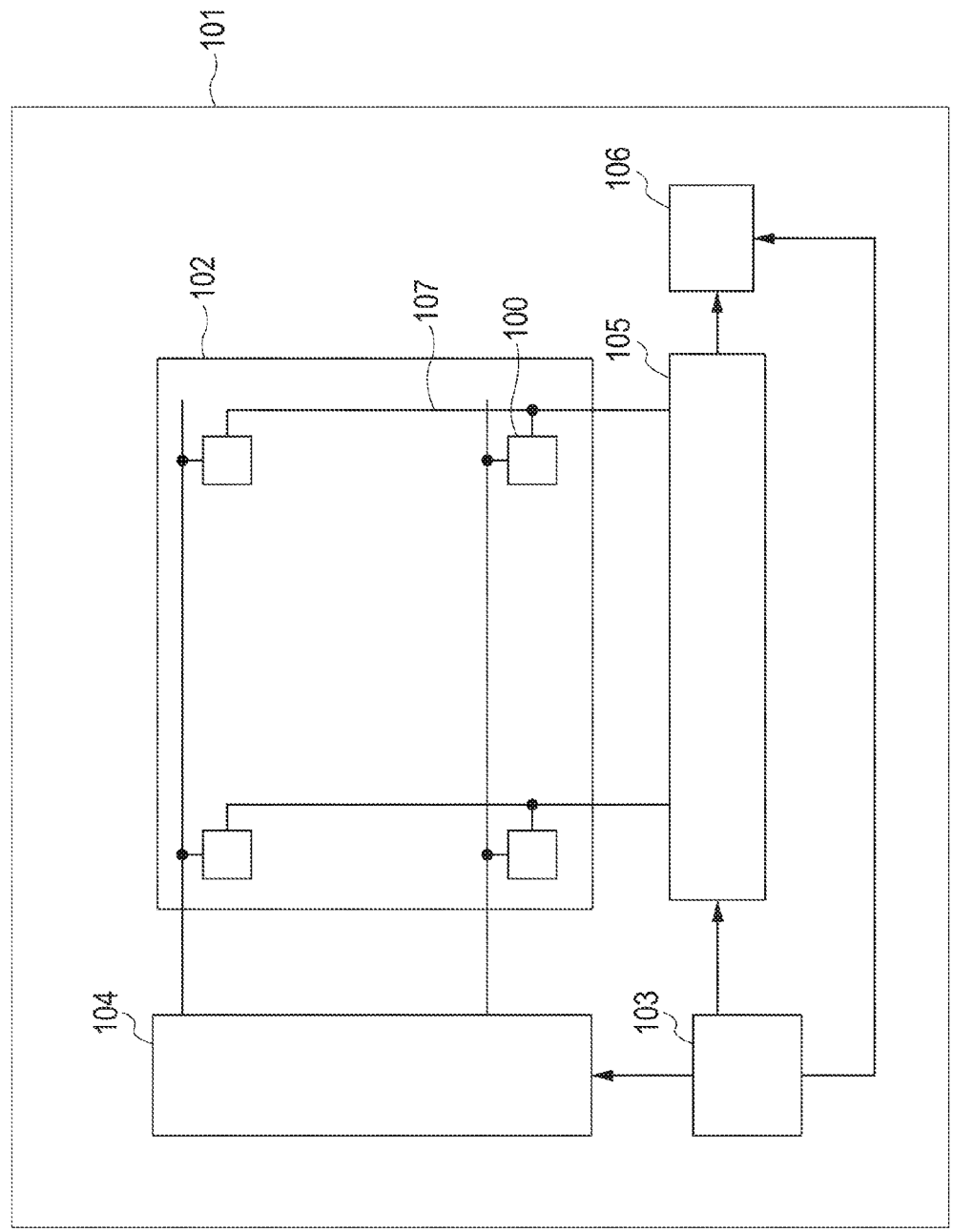
FIG. 1 is a block diagram illustrating an image pickup apparatus.

An embodiment of an image pickup apparatus applicable to the invention will be described with reference to FIGS. 1 to 6. Members denoted by similar reference numerals indicate similar elements or similar regions in the respective drawings.

FIG. 1 illustrates a block diagram of the image pickup apparatus 101 serving as an embodiment of the invention. The image pickup apparatus 101 includes a pixel unit 102, a drive pulse generation unit 103, a vertical scanning circuit 104, a signal processing unit 105, an output unit 106, and a vertical signal line 107.

The pixel unit 102 includes a plurality of pixels 100 that convert light to an electric signal and outputs the converted electric signal. The plurality of pixels 100 is arranged in a matrix form. The plurality of vertical signal lines 107 is arranged such that each of the vertical signal lines 107 is arranged at each of pixel columns of the plurality of pixels 100. The drive pulse generation unit 103 generates drive pulses and the vertical scanning circuit 104 receives the drive pulses from the drive pulse generation unit 103 to supply control pulses to the respective pixels. The drive pulses supplied here are, as will be described later, pTX that drives transfer transistors, pRES that drives a reset transistor, pSEL that drives a selection transistor.

The plurality of vertical signal lines 107 is arranged such that each of the vertical signal lines 107 is arranged at each of the pixel columns of the pixel unit 102.

Signals parallelly output via the vertical signal lines 107 are input to the signal processing unit 105. Subsequently, the signal processing unit 105 serializes the signals parallelly output from the plurality of pixel columns to transmit to the output unit 106. The signal processing unit 105 may additionally include a column circuit to carry out amplification, AD conversion, and the like on signals.

Figure 2:
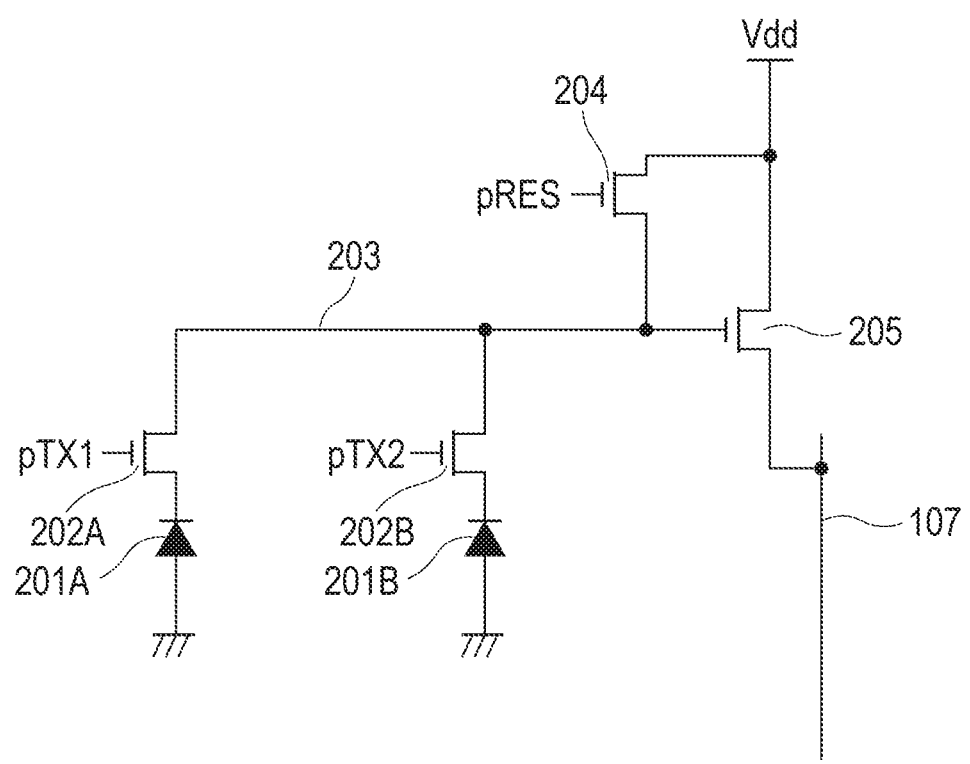
FIG. 2 is a circuit diagram of a pixel.

FIG. 2 illustrates an exemplary equivalent circuit of one pixel. In the embodiment, among a pair of electric carriers generated in a first photoelectric conversion unit 201A and a second photoelectric conversion unit 201B, a polarity of an electric carrier used as a signal carrier is referred to as second conductivity type.

In the description of the embodiment, as an example, a first conductivity type is assumed as a P-type, whereas the second conductivity type acting as a conductivity type opposite to the first conductivity type is assumed as an N-type. However, the configuration is not limited thereto and the P-type and the N-type may be reversed. Reference characters A and B are used to identify each of the photoelectric conversion units. However, portions thereof having similar functions are described without adding the reference characters. When it is necessary to describe by distinguishing both from each other, the reference characters are used for description.

In the photoelectric conversion units 201, a pair of electric carriers is generated in accordance with incident light. For example, photodiodes are used for the photoelectric conversion units 201.

A first transfer transistor 202A transfers an electron generated in the first photoelectric conversion unit 201A to a floating diffusion (hereinafter, referred to as FD) 203. A second transfer transistor 202B transfers an electron generated in the second photoelectric conversion unit 201B to the FD 203.

The FD 203 is shared by the first photoelectric conversion unit 201A and the second photoelectric conversion unit 201B. In addition, the FD 203 accumulates the electrons transferred by the first transfer transistor 202A and the second transfer transistor 202B.

A gate electrode of an amplification transistor 205 is connected to the FD 203 and the amplification transistor 205 amplifies signals based on the electrons transferred to the FD 203 by the first transfer transistor 202A and the second transfer transistor 202B to output. More specifically, the electrons transferred to the FD 203 are converted to voltages in accordance with amounts thereof and electric signals in accordance with those voltages are output to the vertical signal line 107 via the amplification transistor 205. The amplification transistor 205 constitutes a source follower circuit together with a current source (not illustrated). The amplification transistor 205 is also shared by the first photoelectric conversion unit 201A and the second photoelectric conversion unit 201B. A selection transistor may be additionally arranged on a vertical line side of the amplification transistor 205.

A reset transistor 204 resets a voltage applied to an input node of the amplification transistor 205.

Methods for controlling an accumulation period of electric carriers for a pixel are approximately categorized into two known methods: an electronic shutter that controls electrically and a mechanical shutter that controls mechanically. First, the accumulation period of electric carriers when the electronic shutter is used will be described with reference to FIG. 3. Thereafter, the accumulation period of electric carriers when the mechanical shutter is used will be described with reference to FIG. 4.

Figure 3:
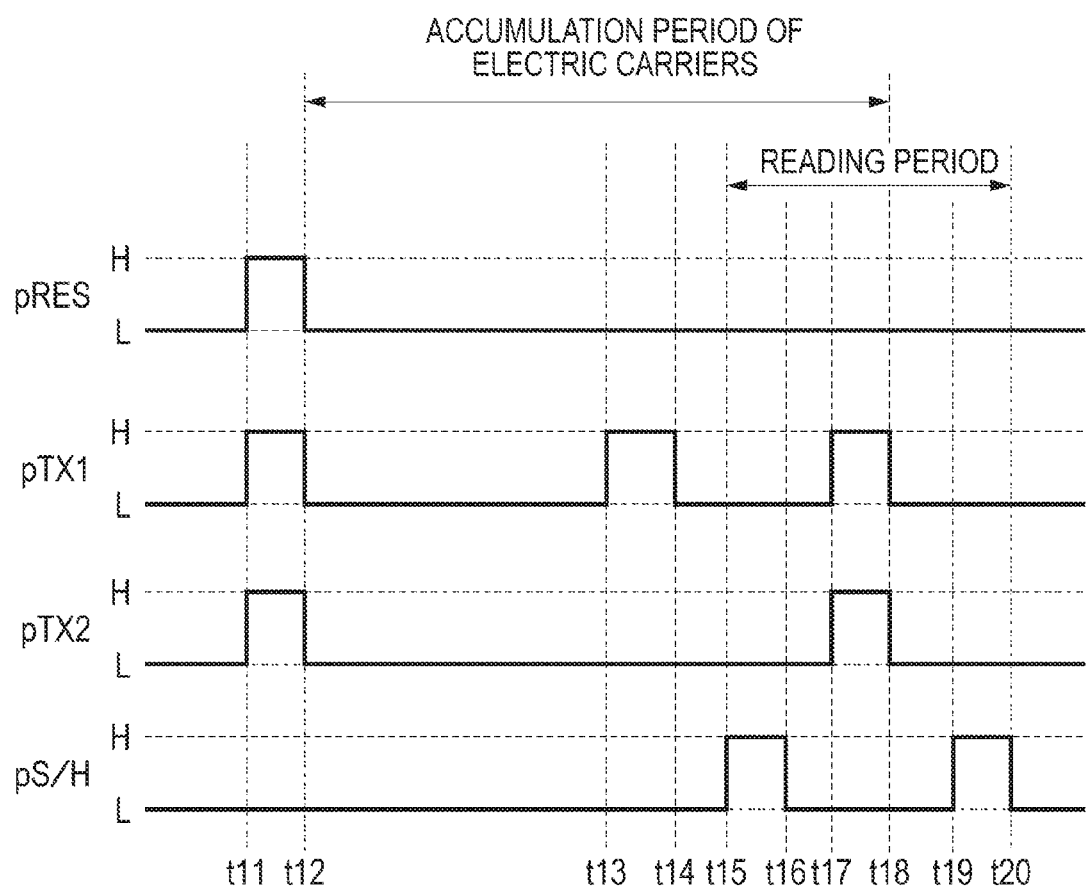
FIG. 3 is a diagram illustrating a driving timing.

FIG. 3 indicates a control pulse pTX1 supplied to a gate electrode of the first transfer transistor 202A and a control pulse pTX2 supplied to a gate electrode of the second transfer transistor 202B. FIG. 3 also indicates a control pulse pRES supplied to the reset transistor 204 that resets the photoelectric conversion units 201 and a control pulse pS/H that samples and holds signals output from the pixels in the signal processing unit 105. Each of the transistors is set to an ON state at a high level and set to an OFF state at a low level. A voltage that sets each of the transistors to the ON state is referred to as on-state voltage, whereas a voltage that sets each of the transistors to the OFF state is referred to as off-state voltage. In the signal processing unit 105, signals from the pixels are sampled during a period where the control pulse pS/H is at a high level and held at a time when a high level shifts to a low level.

The control pulses pRES, pTX1, and pTX2 shift to a high level from a low level at a time t11 and then the first photoelectric conversion unit 201A and the second photoelectric conversion unit 201B are reset.

When the control pulses pRES, pTX1, and pTX2 shift to a low level from a high level at a time t12, resetting of the first photoelectric conversion unit 201A and the second photoelectric conversion unit 201B is completed and then the accumulation period of electric carriers for the first photoelectric conversion unit 201A and the second photoelectric conversion unit 201B is started.

The control pulse pTX1 shifts to a high level from a low level at a time t13, and then the control pulse pTX1 shifts to a low level from a high level at a time t14. Through this operation, electrons generated in the first photoelectric conversion unit 201A during a period from t12 to t14 are transferred to the FD 203. During a period from t13 to t14, the control pulse pTX2 is kept at a low level.

The control pulse pS/H shifts to a high level from a low level at a time t15, and then the control pulse pS/H shifts to a low level from a high level at a time t16. Through this operation, signals based on the electrons generated in the first photoelectric conversion unit 201A during the period from t12 to t14 are introduced into the signal processing unit 105.

The control pulses pTX1 and pTX2 simultaneously shift to a high level from a low level at a time t17, and then the control pulses pTX1 and pTX2 simultaneously shift to a low level from a high level at a time t18. Through this operation, electrons generated in the first photoelectric conversion unit 201A during a period from t14 to t18 and electrons generated in the second photoelectric conversion unit 201B during a period from t12 to t18 are transferred to the FD 203.

The control pulse pS/H shifts to a high level from a low level at a time t19, and then the control pulse pS/H shifts to a low level from a high level at a time t20. Through this operation, added signals obtained by adding signals based on the electrons generated in the second photoelectric conversion unit 201B during the period from t12 to t18 and signals based on the electrons generated in the first photoelectric conversion unit 201A during the period from t14 to t18 are introduced into the signal processing unit 105.

Here, the accumulation period of electric carriers in the embodiment is a period from t12 to t18 and a reading period is a period from t15 to t20. The accumulation period of electric carriers is started at a time when reset operation of the photoelectric conversion units is terminated. The accumulation period of electric carriers is ended at a time when transfer operation of signals required for forming one pixel from the photoelectric conversion units is completed at the last time. In the embodiment, the control pulses pTX1 and pTX2 shift to a low level from a high level at the time t18 and the accumulation period of electric carriers is ended at this point in time. Meanwhile, the reading period is started at a time when signals based on the electrons generated during the accumulation period of electric carriers are started to be read to the outside of the pixel. The reading period is ended at a time when, among the signals based on the electrons generated during the accumulation period of electric carriers, all signals to be read to the outside of the pixel are introduced into the signal processing unit 105. In the embodiment, the control pulse pS/H shifts to a high level from a low level at the time t15, and then the signals based on the electrons generated in the first photoelectric conversion unit 201A during the period from t12 to t14, which is a partial period of the accumulation period of electric carriers, are started to be read to the outside of the pixel. Thereafter, the control pulse pS/H shifts to a low level from a high level at the time t20 and the reading to the outside of the pixel is ended at this point in time.

By carrying out subtraction processing between the signals based on electric carriers of the first photoelectric conversion unit 201A which have been read out earlier and the signals based on added electric carriers, signals based on electric carriers of the second photoelectric conversion unit 201B can be obtained.

The control pulse pS/H may be shifted to a high level from a low level during a period from t12 to t13 such that a noise signal generated during the resetting carried out during a period from t11 to t12 is read out to the outside of the pixel.

In the embodiment, the reading period of the signals to the outside of the pixel is started in the middle of the accumulation period of electric carriers and accordingly, both of the periods overlap. However, the reading period may be started after the accumulation period of electric carriers is ended. In addition, the accumulation period of electric carriers is started at the same time and ended at the same time for both of the first photoelectric conversion unit 201A and the second photoelectric conversion unit 201B. However, the accumulation period of electric carriers may be shifted between the first photoelectric conversion unit 201A and the second photoelectric conversion unit 201B. In regard to the start of the accumulation period of electric carriers for the pixel in such a case, among start times of the accumulation periods of electric carriers for the respective photoelectric conversion units, the accumulation period of electric carriers for the pixel is started at a start time of an accumulation period of electric carriers for one of the photoelectric conversion units whose accumulation period of electric carriers is started earlier. Likewise, in regard to the end of the accumulation period of electric carriers for the pixel, among end times of the accumulation periods of electric carriers for the respective photoelectric conversion units, the accumulation period of electric carriers for the pixel is ended at an end time of an accumulation period of electric carriers for one of the photoelectric conversion units whose accumulation period of electric carriers is ended later.

Next, the accumulation period of electric carriers when the mechanical shutter is used will be described with reference to FIG. 4. The respective control pulses are similar to those in FIG. 3. The mechanical shutter is different from the electronic shutter in FIG. 3 in that the mechanical shutter opens at a time t23 such that entrance of light to the respective photoelectric conversion units is started and the mechanical shutter closes at a time t24 such that entrance of light to the respective photoelectric conversion units is ended. In the mechanical shutter, the accumulation period of electric carriers is stated at a time when the mechanical shutter opens. Therefore, the accumulation period of electric carriers is started at the time t23 in FIG. 4 when the mechanical shutter opens. Other configuration is similar to that in FIG. 3.

Furthermore, a configuration for electronically controlling the start of the accumulation period of electric carriers to end exposure using the mechanical shutter is also considered. In such a case, the accumulation period of electric carriers is defined as in the case of the electronic shutter.

In the embodiment, the number of times the on-state voltage is supplied to the gate electrode of the first transfer transistor is larger than the number of times the on-state voltage is supplied to the gate electrode of the second transfer transistor during the accumulation period of electric carriers and the reading period. Accordingly, when the gate electrode of the first transfer transistor is located in a short distance from a contact plug that supplies a reference voltage to a semiconductor region serving as a channel region for the respective transfer transistors, an image quality is affected in some cases.

Figure 5A:
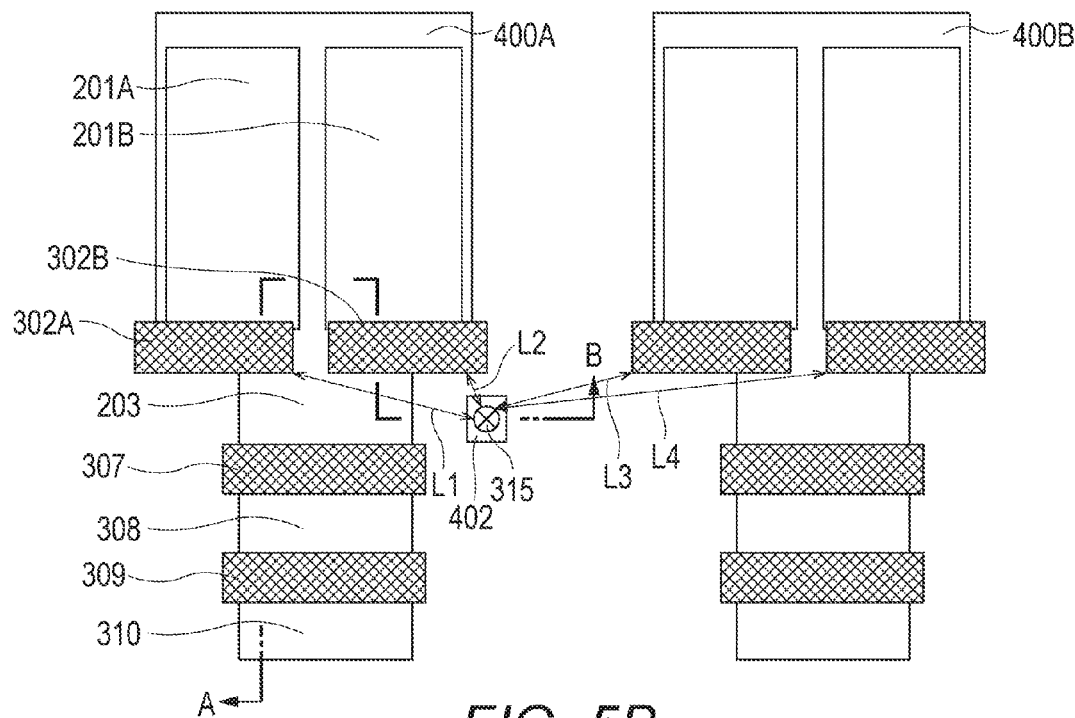
FIGS. 5A and 5B are schematic plan views illustrating pixel units.
Figure 5B:
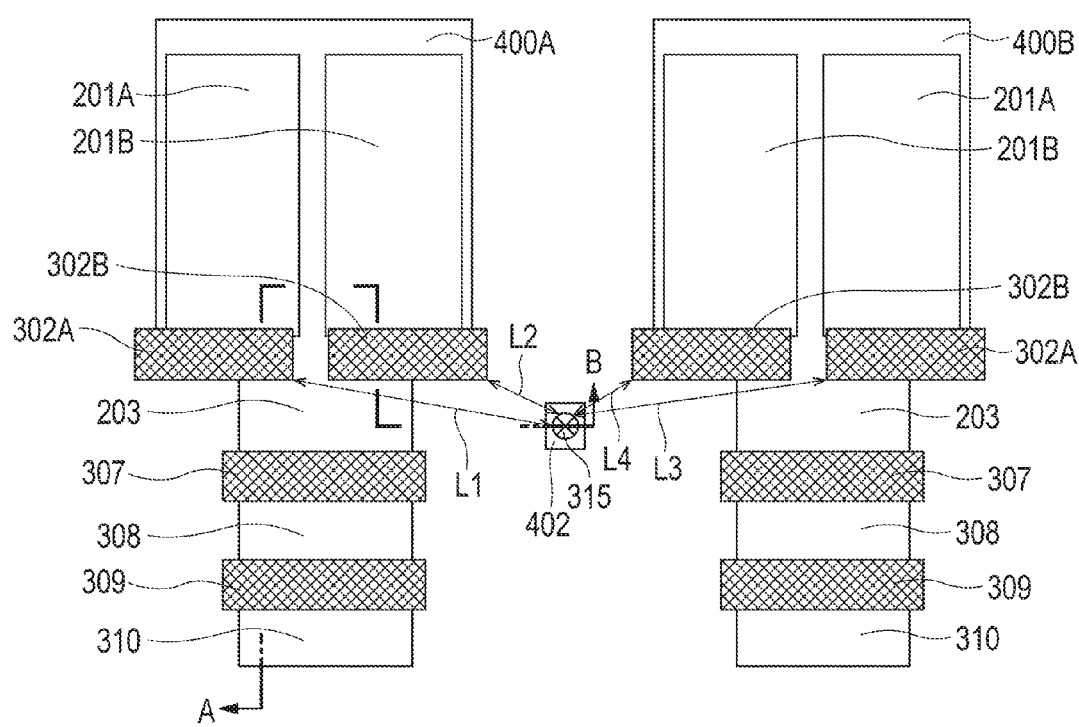
Figure 6:
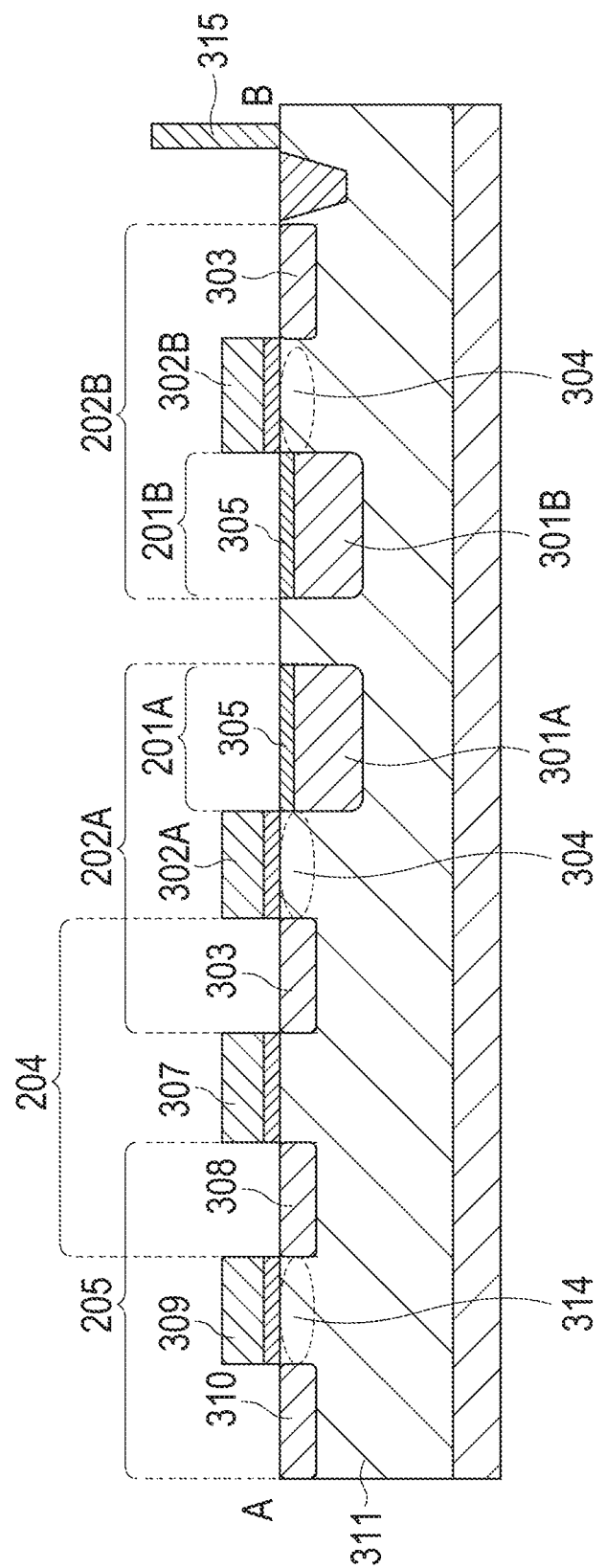
FIG. 6 is a schematic cross-sectional view illustrating a first active region.

FIGS. 5A and 5B illustrate schematic plan views of the image pickup apparatus according to the embodiment, whereas FIG. 6 illustrates a schematic cross-sectional view of the image pickup apparatus according to the embodiment. Here, two pixels adjacent to each other are depicted. The photoelectric conversion units, the FD, and the transistors of a pixel indicated on the left side of the drawing are arranged in a first active region 400A, while the photoelectric conversion units, the FD, and the transistors of a pixel indicated on the right side of the drawing are arranged in a first active region 400B. Hereinafter, when it is not particularly necessary to distinguish the first active regions from each other, the reference characters A and B are not added for description. On the other hand, when it is necessary to describe the distinguish of the two pixels adjacent to each other, the pixel indicated on the left side of FIGS. 5A and 5B is referred to as first pixel and the pixel indicated on the right side thereof is referred to as second pixel.

In FIGS. 5A and 5B, the pixel includes the first photoelectric conversion unit 201A, the second photoelectric conversion unit 201B, a gate electrode 302A, a gate electrode 302B, the FD 203, the amplification transistor 205, and the reset transistor 204. The first photoelectric conversion unit 201A, the second photoelectric conversion unit 201B, the FD 203, sources of the respective transistors, and a drain region are arranged in the first active region 400.

A second active region 402 to which a contact plug 315 is connected is arranged between the first active regions 400A and 400B of the two pixels adjacent to each other. In the embodiment, an insulator isolation portion is arranged between the first active region 400 and the second active region 402 as another active region. However, the second active region 402 may be integrated into one of the first active regions 400A and 400B as the same active region. The contact plug 315 supplies the reference voltage to a P-type semiconductor region arranged in the second active region 402. A voltage supply wire (not illustrated) is connected to the contact plug 315 and the reference voltage is supplied through this voltage supply wire.

An N-type third semiconductor region 301A partially constituting the first photoelectric conversion unit 201A and an N-type fourth semiconductor region 301B partially constituting the second photoelectric conversion unit 201B are arranged in the first active region 400. Additionally, an N-type fifth semiconductor region 303 constituting a source region of the FD 203 and the reset transistor 204 is arranged in the first active region 400. An N-type semiconductor region 310 constituting a source region of the amplification transistor 205 and an N-type semiconductor region 308 constituting a drain region of the reset transistor 204 and the amplification transistor 205 are also arranged in the first active region 400. The gate electrode 302A of the first transfer transistor 202A and the gate electrode 302B of the second transfer transistor 202B are arranged side by side on the top of the first active region 400 when viewed from above.

Here, in both of configurations in FIGS. 5A and 5B, among the gate electrodes of the transfer transistors, a gate electrode with a shortest distance to the contact plug is the gate electrode of the second transfer transistor. A difference between FIGS. 5A and 5B is a position where the contact plug 315 is arranged.

In FIGS. 5A and 5B, L1 represents a distance between the gate electrode 302A of the first transfer transistor 202A in the first pixel and the contact plug 315. L2 represents a distance between the gate electrode 302B of the second transfer transistor 202B in the first pixel and the contact plug 315. L3 represents a distance between the gate electrode 302A of the first transfer transistor 202A in the second pixel and the contact plug 315. L4 represents a distance between the gate electrode 302B of the second transfer transistor 202B in the second pixel and the contact plug 315. Note that a distance here indicates a shortest distance from the contact plug 315 to the gate electrode 302A or the gate electrode 302B when viewed from above.

In FIG. 5A, formula 1 is satisfied.

$$L2<L1<L3<L4 \quad \text{Formula 1}$$

Meanwhile, in FIG. 5B, formula 2 is satisfied.

$$L2=L4<L1=L3 \quad \text{Formula 2}$$

In FIG. 5A, the first pixel is the only pixel having the shortest distance L2 among the plurality of pixels. Accordingly, the distance L2 between the contact plug 315 and the gate electrode 302B is shorter than the distance L1 between the contact plug 315 and the gate electrode 302A. Additionally, the distance L2 between the contact plug 315 and the gate electrode 302B is shorter than the distance L3 between the contact plug 315 and the gate electrode 302A and the distance L4 between the contact plug 315 and the gate electrode 302B. As long as this relationship is satisfied, the positions of the gate electrode 302A and the gate electrode 302B in the second pixel may be reversed. Meanwhile, in FIG. 5B, two pixels, namely, the first pixel and the second pixel have the shortest distances L2 among the plurality of pixels. Accordingly, the distance L2 between the contact plug 315 and the gate electrode 302B is equal to the distance L4 between the contact plug 315 and the gate electrode 302B. In addition, the distance L1 between the contact plug 315 and the gate electrode 302A is equal to the distance L3 between the contact plug 315 and the gate electrode 302A. Furthermore, the distance L4 (distances L2) is shorter than the distance L1 (distance L3).

As illustrated in FIGS. 5A and 5B, the gate electrode of the transfer transistor arranged closest to the contact plug 315 is configured as a gate electrode with a fewer number of times the on-state voltage is supplied, whereby changes in a voltage applied to the contact plug 315 can be suppressed.

Next, the schematic cross-sectional view taken along A-B lines in FIGS. 5A and 5B will be described with reference to FIG. 6 to describe effects obtained by reducing changes in the voltage applied to the contact plug 315.

A major difference between FIGS. 5A and 5B is a distance from the contact plug 315 to the FD 203. Thus, FIG. 6 simply indicates one drawing for description.

In FIG. 6, the first photoelectric conversion unit 201A has a PN junction constituted by the third semiconductor region 301A and a P-type semiconductor region 311. The second photoelectric conversion unit 201B has a PN junction constituted by the fourth semiconductor region 301B and the P-type semiconductor region 311. For example, the first photoelectric conversion unit 201A and the second photoelectric conversion unit 201B are photodiodes. In addition, a P-type semiconductor region having a higher concentration than the P-type semiconductor region 311 may be arranged between the third semiconductor region 301A and the fourth semiconductor region 301B to function as a potential barrier.

The second-conductivity type fifth semiconductor region 303 constitutes the FD 203. Electrons transferred from the first photoelectric conversion unit 201A and the second photoelectric conversion unit 201B are held by a capacitance configured by a PN junction constituted by the P-type semiconductor region 311 and the fifth semiconductor region 303.

Additionally, the N-type semiconductor region 308 and the N-type semiconductor region 310 are arranged in the P-type semiconductor region 311.

Furthermore, the gate electrode 302A, the gate electrode 302B, a gate electrode 307, and a gate electrode 309 are arranged on the top of the first active region 400.

A first-conductivity type first semiconductor region 304 serving as the channel region is arranged below the gate electrode 302A of the first transfer transistor 202A. Likewise, a first-conductivity type first semiconductor region 304 serving as the channel region is arranged below the gate electrode 302B of the second transfer transistor 202B. In addition, a first-conductivity type second semiconductor region 314 serving as the channel region is arranged below the gate electrode 309 of the amplification transistor. In the embodiment, the P-type semiconductor region 311 functions as a semiconductor region serving as the channel region for all of the first and second transfer transistors and the amplification transistor. However, impurities may be additionally injected into portions of the P-type semiconductor region 311 under the gate electrodes of the respective transistors such that the impurity concentrations thereof are differentiated relative to the P-type semiconductor region 311.

The contact plug 315 supplied with the reference voltage is connected to the P-type semiconductor region 311. With such a configuration, the reference voltage can be supplied to the first semiconductor regions 304 and the second semiconductor region 314 via the contact plug 315 and the P-type semiconductor region 311. This contact plug 315 is made of, for example, metal such as tungsten or alloy. A member made of titanium and/or titanium nitride may be arranged between the contact plug 315 and the P-type semiconductor region 311 such that the contact plug 315 makes contact with the P-type semiconductor region 311 through this member. In addition, a P-type semiconductor region having a higher concentration than the P-type semiconductor region 311 may be provided at a portion of the P-type semiconductor region 311 making contact with the contact plug 315.

A first-conductivity type semiconductor region is continuously arranged in the P-type semiconductor region 311 from a portion thereof to which the contact plug 315 is connected to the semiconductor regions below the gate electrode 302A and the gate electrode 302B. With such a configuration, the reference voltage from the contact plug 315 can be supplied to these semiconductor regions below the gate electrodes.

The P-type semiconductor region 311 is a semiconductor region serving as the channel region for the transfer transistors and the amplification transistor, or a semiconductor region within which the semiconductor regions serving as the channel regions therefor are arranged. Accordingly, changes in the voltage applied to the contact plug 315 vary a voltage applied to the P-type semiconductor region 311, affecting operation of the respective transistors. With this, the image quality is affected.

In contrast to this, in the arrangements illustrated in FIGS. 5A and 5B, the gate electrode of the transfer transistor arranged in a shorter distance to the contact plug 315 is configured as one with a fewer number of times the on-state voltage is supplied. Therefore, the influence on the image quality described above can be reduced.

Hereinafter, the invention will be described in detail using exemplary embodiments.

First Exemplary Embodiment

An image pickup apparatus according to the present exemplary embodiment will be described with reference to FIGS. 8 to 10. Members denoted by similar reference numerals to those in FIGS. 1 to 7 indicate similar elements or similar regions in the respective drawings. A pixel according to the exemplary embodiment is configured as having a selection transistor 206 in addition to the configuration illustrated in FIG. 2.

Schematic plan views will be described with reference to FIGS. 8 and 9. The pixels are arranged in two rows and two columns, accordingly, four pixels in total are depicted. Reference characters A, B, C, and D are used to identify respective active regions. However, portions thereof having similar functions are described without adding the reference characters. When it is necessary to describe by distinguishing the active regions from one another, the reference characters are used for description. In addition, in a case where configurations in a first row and a second row are similar to each other, the description thereof will be omitted.

Figure 8:
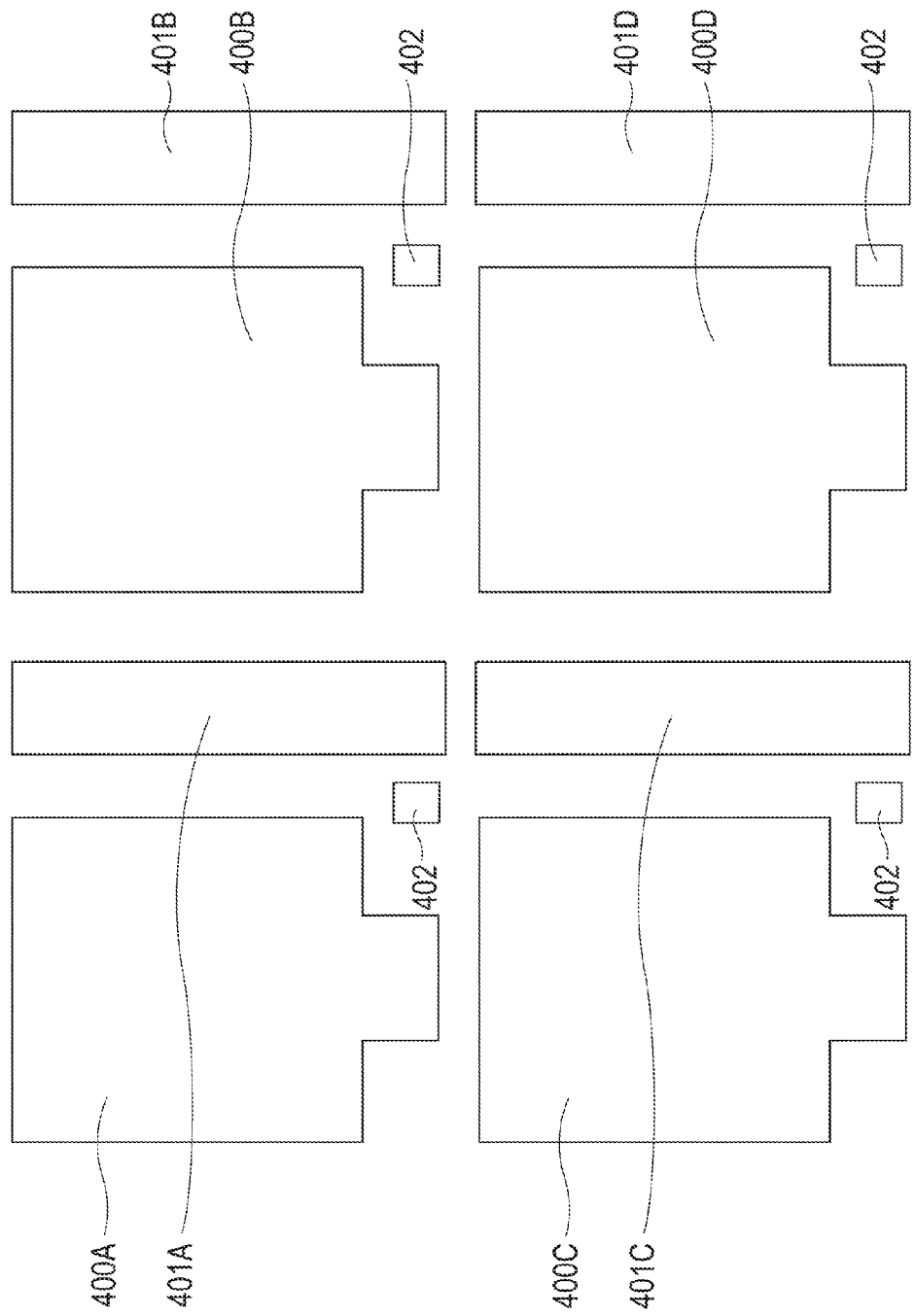
FIG. 8 is a schematic plan view illustrating a pixel unit.

FIG. 8 simply indicates a first active region 400, a second active region 402, and a third active region 401 for plain description of the active regions. The first active region 400, the second active region 402, and the third active region 401 are arranged with insulator element isolation portions interposed therebetween. Additionally, the second active region 402 is arranged in a region between the first active region 400 and the third active region 401 when viewed from above. The contact plug is provided in each of the second active regions 402. In the exemplary embodiment, the number of the pixels is equal to the number of the contact plugs.

Figure 9:
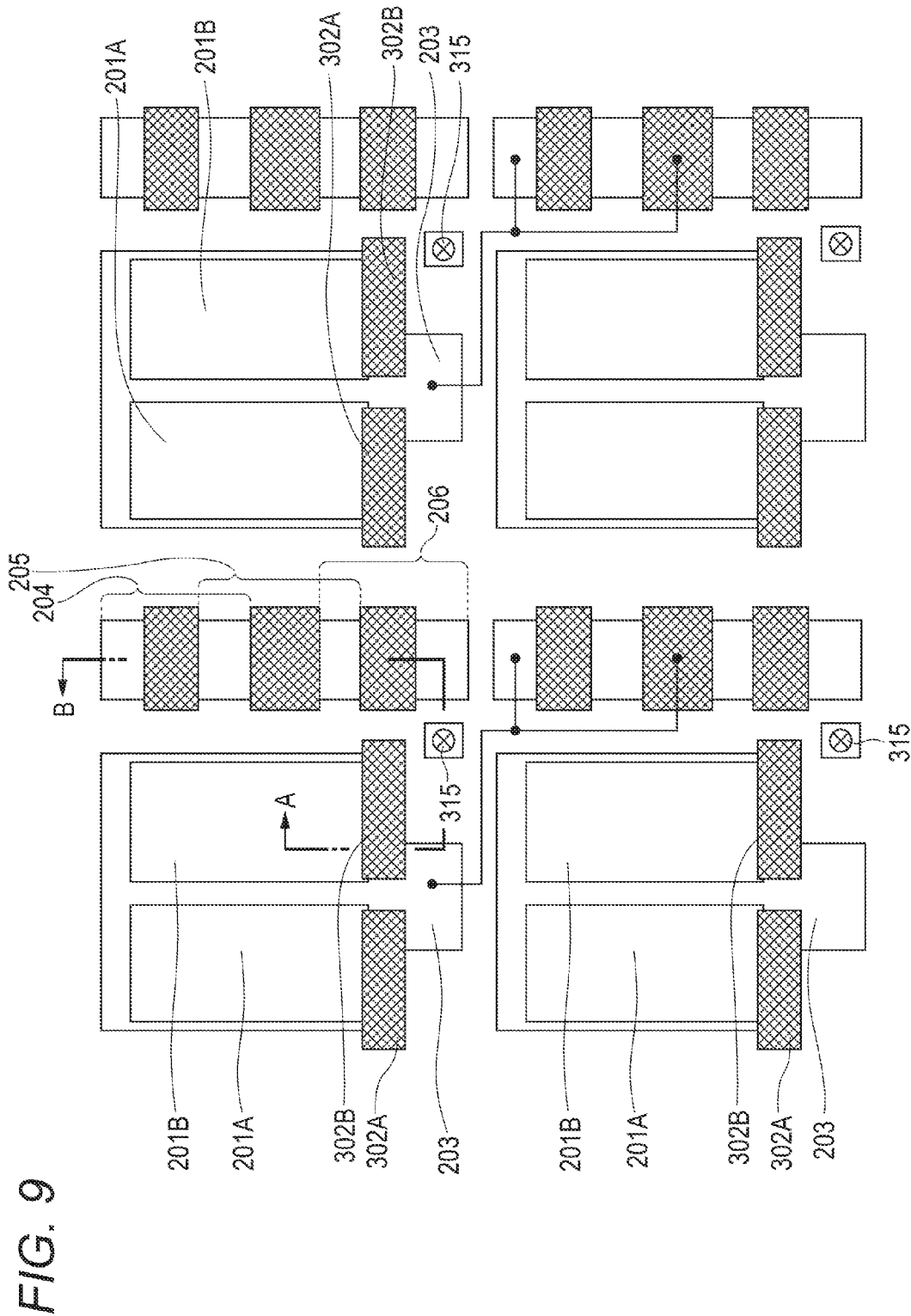
FIG. 9 is a schematic plan view illustrating the pixel unit.

As illustrated in FIG. 9, transistors of a pixel that processes signals from photoelectric conversion units arranged in the first first active region 400A are arranged in the third third active region 401C. Likewise, transistors of a pixel that processes signals from photoelectric conversion units arranged in the second first active region 400B are arranged in the fourth third active region 401D.

As illustrated in FIG. 9, a first photoelectric conversion unit 201A, a second photoelectric conversion unit 201B, and an N-type fifth semiconductor region 303 constituting an FD 203 are arranged in the first first active region 400A. The first active region 400 and the third active region 401 are arranged side by side along a direction perpendicular to a transfer direction of electric carriers from a third semiconductor region 301A and a fourth semiconductor region 301B to the fifth semiconductor region 303.

A gate electrode 302A of a first transfer transistor 202A and a gate electrode 302B of a second transfer transistor 202B are arranged on the top of the first first active region 400A when viewed from above.

An N-type semiconductor region constituting a source of the selection transistor 206 and an N-type semiconductor region constituting a source of an amplification transistor 205 and a drain of the selection transistor 206 are arranged in the third active region 401. In addition, an N-type semiconductor region constituting a drain of the amplification transistor 205 and a drain of a reset transistor 204 are arranged in the third active region 401. Furthermore, an N-type semiconductor region constituting a source of the reset transistor 204 and an N-type semiconductor region constituting a source of the selection transistor 206 are arranged in the third active region 401.

Additionally, the fifth semiconductor region 303 in the first first active region 400A is electrically connected to a gate electrode of the amplification transistor 205 arranged in the third third active region 401C via a conductor. Likewise, the fifth semiconductor region 303 in the second first active region 400B is electrically connected to the gate electrode of the amplification transistor 205 arranged in the fourth third active region 401D via a conductor.

A schematic cross-sectional view taken along A-B line in FIG. 9 will be described with reference to FIG. 10. Description of elements having similar functions as those in FIG. 6 will be omitted.

Figure 10:
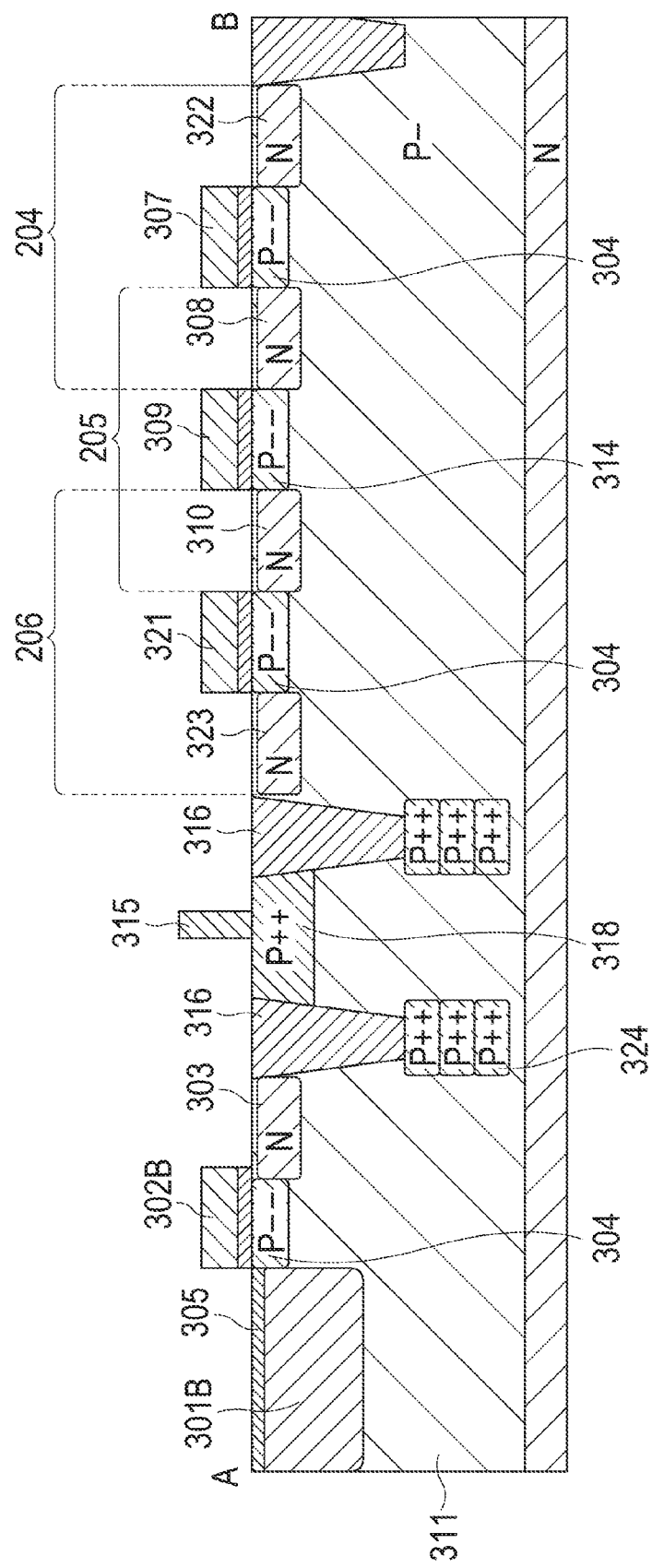
FIG. 10 is a schematic cross-sectional view illustrating a first active region.

In FIG. 10, a P-type semiconductor region 318 whose impurity concentration is higher than that of a P-type semiconductor region 311 is arranged within the P-type semiconductor region 311. A contact plug 315 is connected to this P-type semiconductor region 318. In the exemplary embodiment, the third active region 401 is defined by insulator element isolation portions 316 and thus the P-type semiconductor region 318 is enclosed by the insulator element isolation portions 316 when viewed from above.

A P-type semiconductor region 324 whose impurity concentration is higher than that of the P-type semiconductor region 311 is also arranged within the P-type semiconductor region 311. Part of the P-type semiconductor region 324 is arranged below the insulator element isolation portion 316 to serve as a channel stop region.

Additionally, a first-conductivity type first semiconductor region 304 serving as the channel region is arranged below the gate electrode 302A of the first transfer transistor 202A. Likewise, a first-conductivity type first semiconductor region 304 serving as the channel region is arranged below the gate electrode 302B of the second transfer transistor 202B.

A first-conductivity type second semiconductor region 314 serving as the channel region is arranged below a gate electrode 309 of the amplification transistor. As described above, the first semiconductor regions 304 and the second semiconductor region 314 are arranged within the P-type semiconductor region 311. Here, the impurity concentrations of the first semiconductor regions 304 and the second semiconductor region 314 are different from the impurity concentration of the P-type semiconductor region 311. As a result, thresholds for the respective transistors can be differentiated from each other.

Second Exemplary Embodiment

Figure 11:
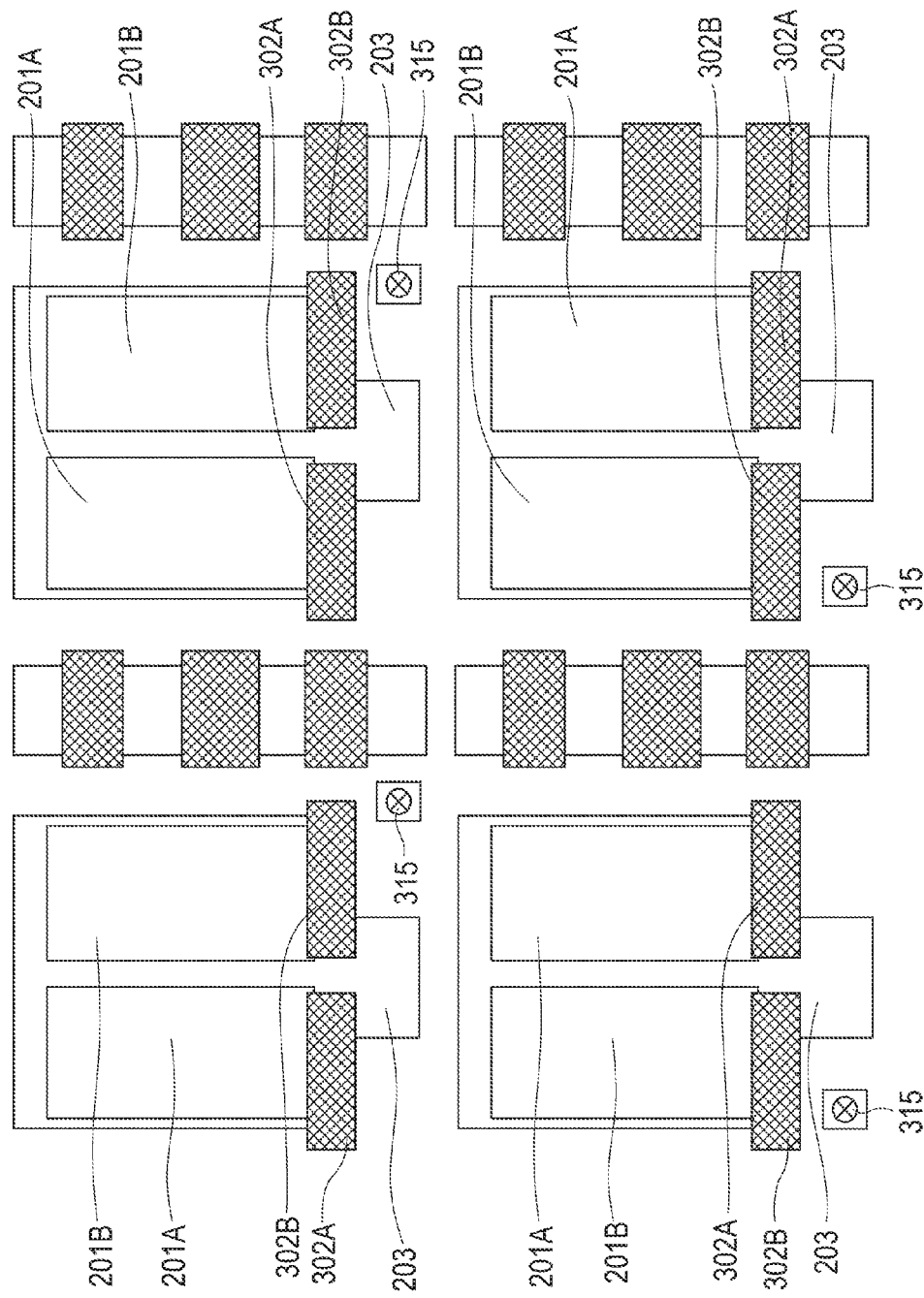
FIG. 11 is a schematic plan view illustrating a pixel unit.

A schematic plan view of an image pickup apparatus according to the present exemplary embodiment will be described with reference to FIG. 11. Members denoted by similar reference numerals indicate similar elements or similar regions in the respective drawings.

A difference between the present exemplary embodiment and the first exemplary embodiment is a position where a second active region 402 is arranged. In the first exemplary embodiment, the contact plugs 315 are arranged at similar positions in the first row and the second row. Compared to this, contact plugs 315 according to the present exemplary embodiment are arranged at different positions. Specifically, the contact plugs 315 are arranged in a zigzag form.

On a pixel in a first row, the second active region 402 is arranged between a first active region 400 in which photoelectric conversion units thereof are arranged and a third active region 401 arranged on the right side thereof. In contrast to this, on a pixel in a second row, the second active region 402 is arranged between a first active region 400 in which photoelectric conversion units thereof are arranged and a third active region 401 arranged on the left side thereof.

The contact plug 315 is arranged in an opposite region relative to a region between a third first active region 400C and a third third active region 401C with a fifth semiconductor region 303 arranged in the third first active region 400C interposed therebetween.

Additionally, in the exemplary embodiment, arrangements of a first photoelectric conversion unit 201A, a second photoelectric conversion unit 201B, a gate electrode 302A, and a gate electrode 302B in the first row are different from those in the second row. Also in the second row, a distance between the contact plug 315 and the gate electrode 302B is shorter than a distance between the contact plug 315 and the gate electrode 302A. In order to obtain such an arrangement, arrangements of the first photoelectric conversion unit 201A and the gate electrode 302A are reversed in arrangements of the second photoelectric conversion unit 201B and the gate electrode 302B.

Third Exemplary Embodiment

Figure 12:
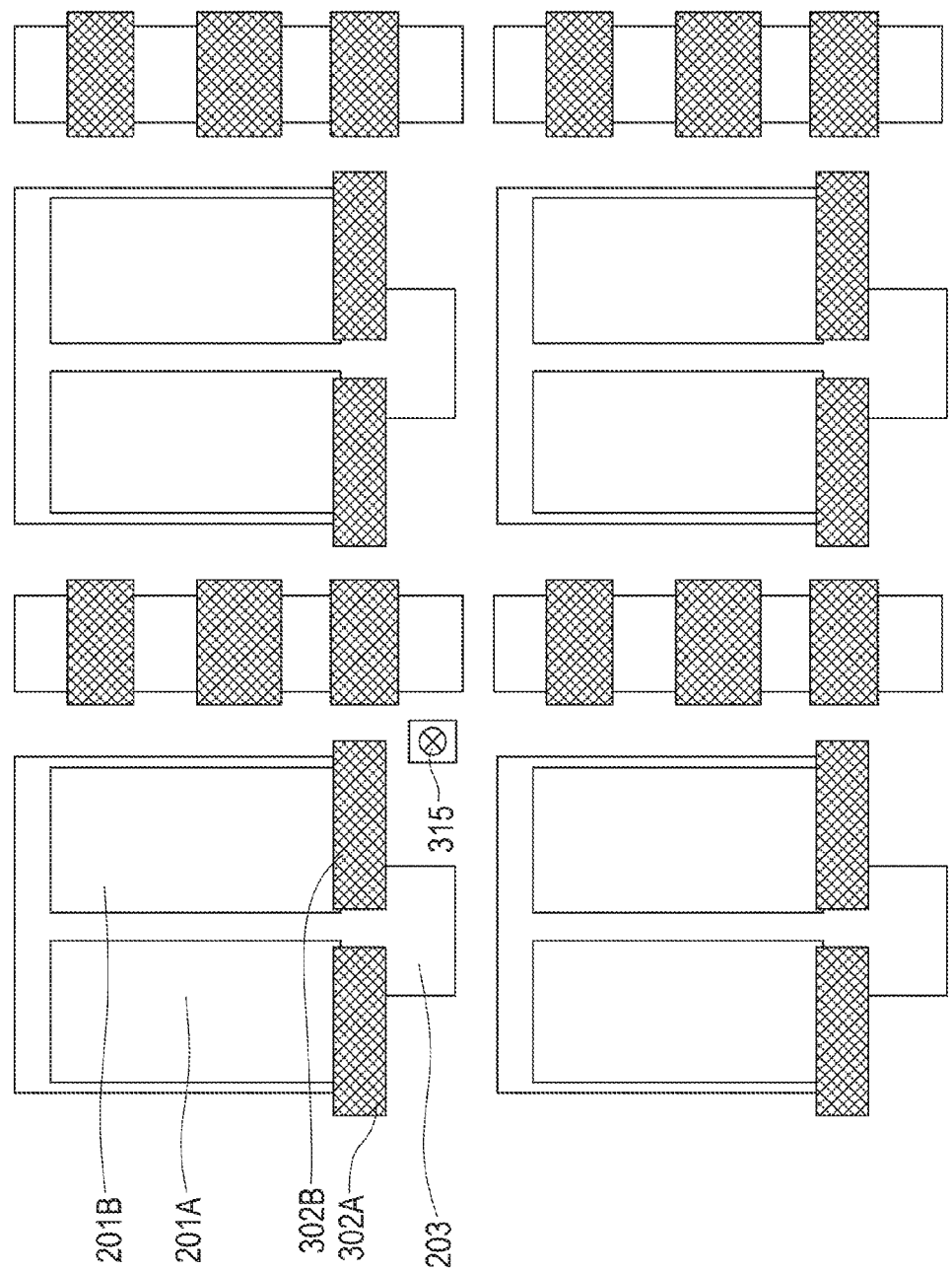
FIG. 12 is a schematic plan view illustrating a pixel unit.

A schematic plan view of an image pickup apparatus according to the present exemplary embodiment will be described with reference to FIG. 12. Members denoted by similar reference numerals indicate similar elements or similar regions in the respective drawings.

A difference between the present exemplary embodiment and the first and second exemplary embodiments will be described. In the first and second exemplary embodiments, the number of the pixels is equal to the number of the contact plugs 315. Compared to this, in the present exemplary embodiment, the number of the contact plugs 315 is smaller than the number of the pixels.

As described above, when the number of the contact plugs 315 is smaller than the number of first active regions 400, a dark current generated from the contact plugs 315 can be reduced.

Additionally, also in the exemplary embodiment, the contact plug 315 supplies the reference voltage to a first semiconductor region 304 via a P-type semiconductor region 311. Accordingly, a parasitic capacitance generated between the contact plug 315 and a gate electrode 302A is suppressed to thereby suppress variations in electric potentials of channels of a first transfer transistor and a second transfer transistor.

Fourth Exemplary Embodiment

Figure 13:
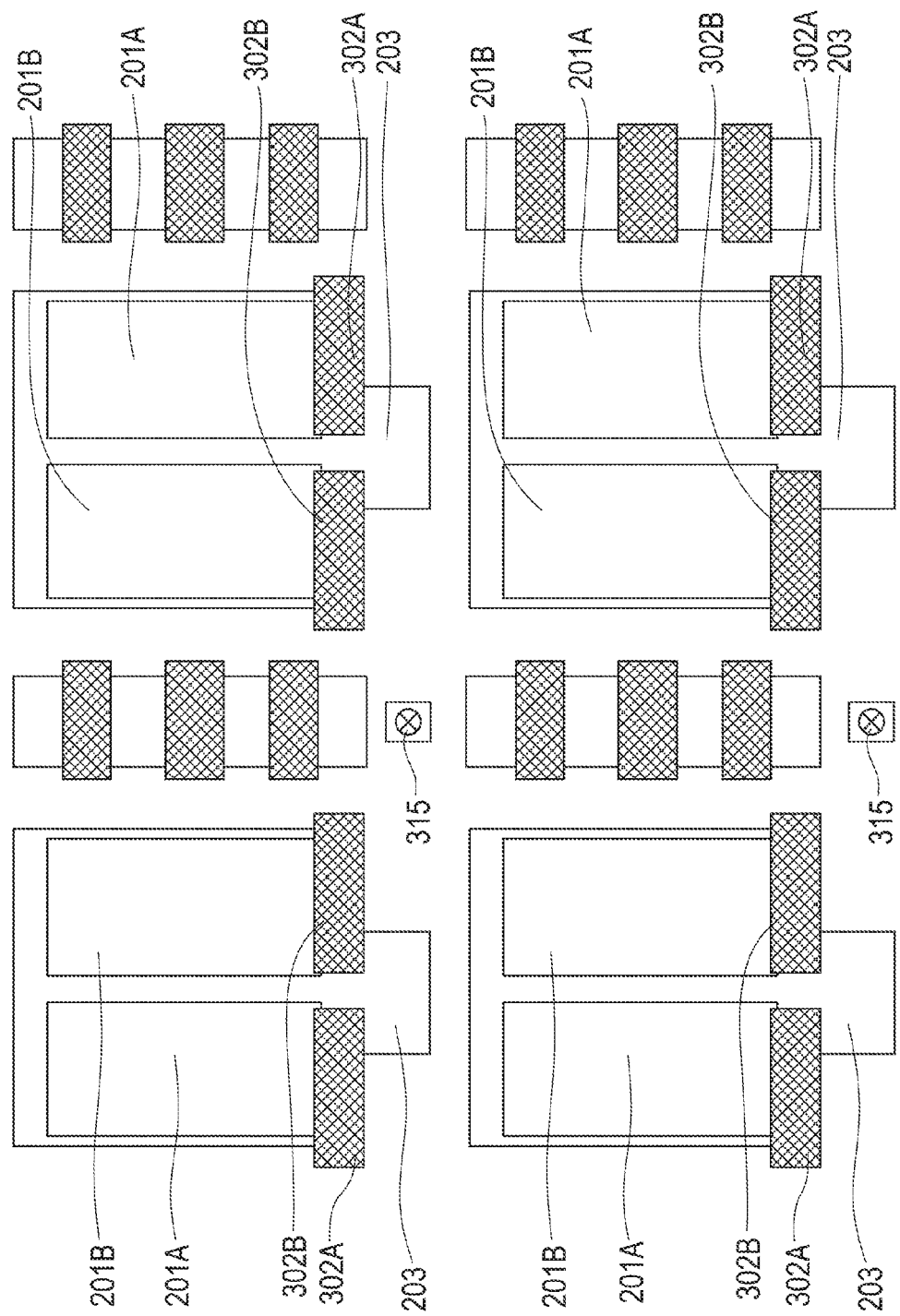
FIG. 13 is a schematic plan view illustrating a pixel unit.

A schematic plan view of an image pickup apparatus according to the present exemplary embodiment will be described with reference to FIG. 13. Members denoted by similar reference numerals indicate similar elements or similar regions in the respective drawings.

A difference between the present exemplary embodiment and the first to third exemplary embodiments will be described. In the first exemplary embodiment, the contact plug 315 has been arranged between the first active region 400 and the third active region 401. In the present exemplary embodiment, a first active region 400 and a third active region 401 are arranged side by side along a direction perpendicular to a transfer direction of electric carriers from a third semiconductor region 301A and a fourth semiconductor region 301B to a fifth semiconductor region 303 when viewed from above. At the same time, the third active region 401 and the contact plug 315 are arranged side by side along the transfer direction of electric carriers from the third semiconductor region 301A and the fourth semiconductor region 301B to the fifth semiconductor region 303 when viewed from above.

In the exemplary embodiment, arrangements of a first photoelectric conversion unit 201A, a second photoelectric conversion unit 201B, a gate electrode 302A, and a gate electrode 302B in a first first active region 400A of a pixel in a first row are reversed in arrangements thereof in a second first active region 400B of a pixel in the first row. The same applies to other rows.

Fifth Exemplary Embodiment

Figure 14:
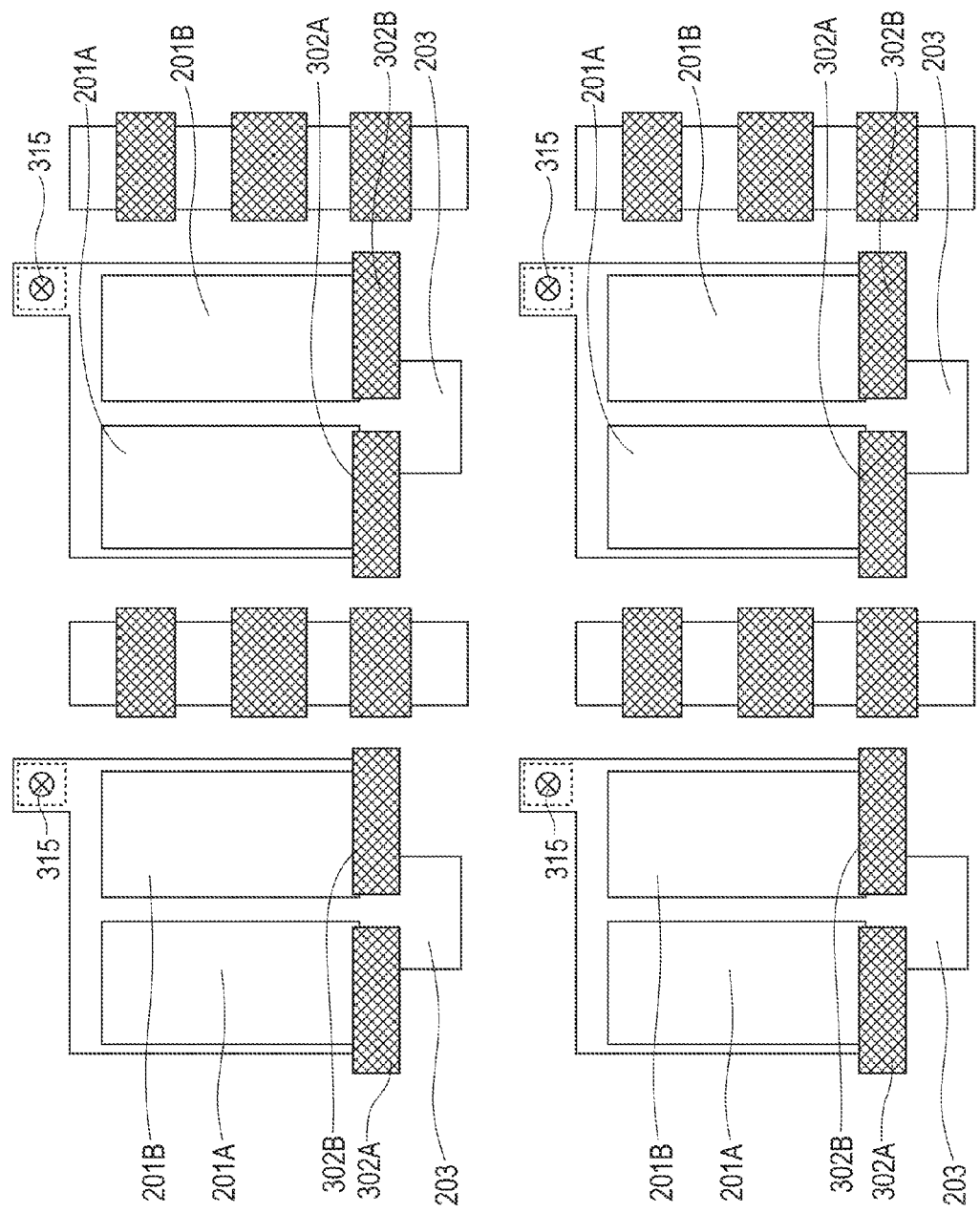
FIG. 14 is a schematic plan view illustrating a pixel unit.

A schematic plan view of an image pickup apparatus according to the present exemplary embodiment will be described with reference to FIG. 14. Members denoted by similar reference numerals indicate similar elements or similar regions in the respective drawings.

The present exemplary embodiment is different from the first to fourth exemplary embodiments in that an active region according to the present exemplary embodiment, in which a semiconductor region being connected to a contact plug is arranged, is the same region as an active region in which photoelectric conversion units are arranged.

In a first active region 400, a second photoelectric conversion unit 201B and a contact plug 315 are arranged with a P-type semiconductor region 311 interposed therebetween when viewed from above.

According to the exemplary embodiment, a transistor constituting a pixel can be easily arranged without reducing an occupied area thereof, whereby property deterioration of the transistor can be suppressed.

Sixth Exemplary Embodiment

Figure 15:
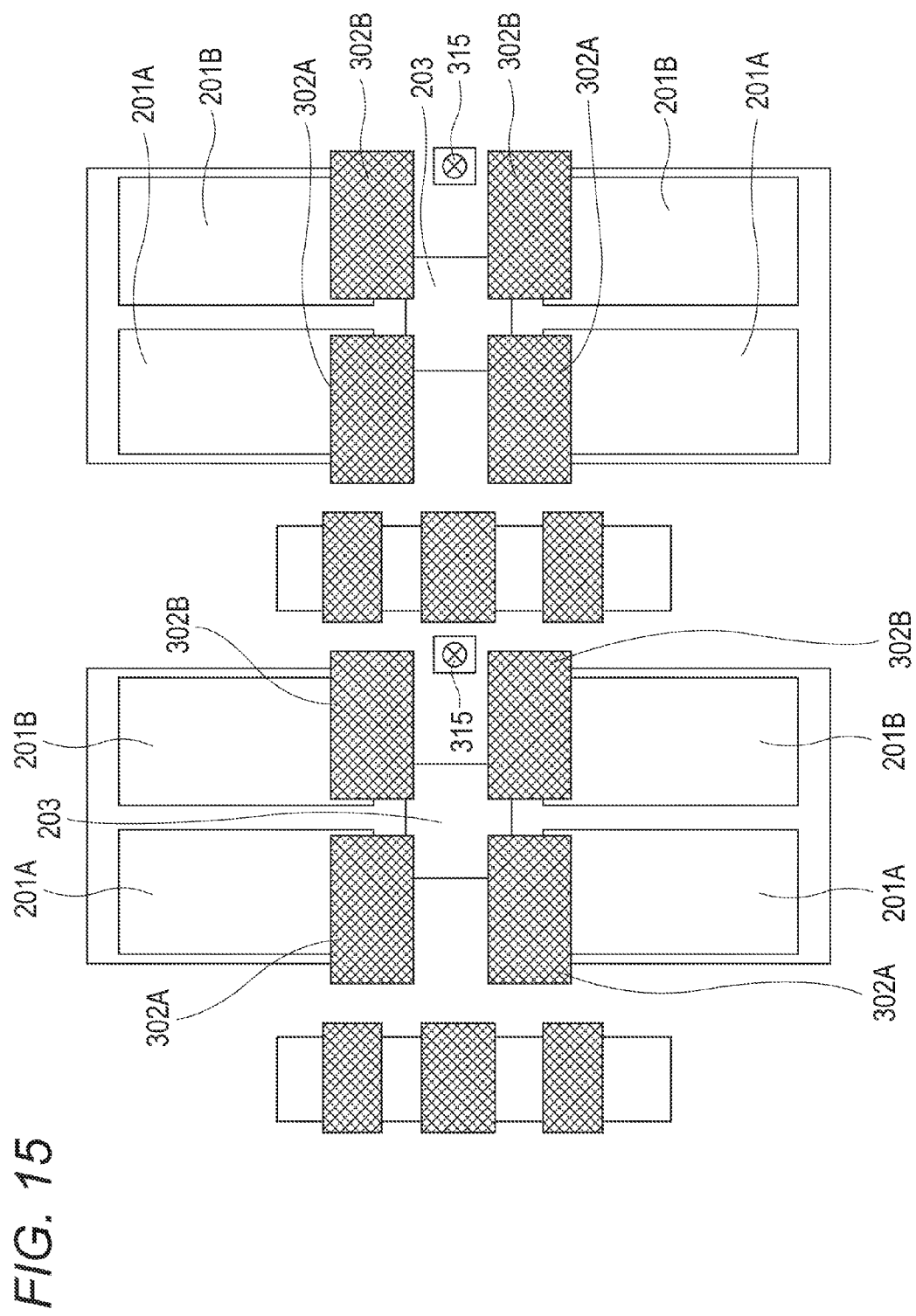
FIG. 15 is a schematic plan view illustrating a pixel unit.

A schematic plan view of an image pickup apparatus according to the present exemplary embodiment will be described with reference to FIG. 15. Members denoted by similar reference numerals indicate similar elements or similar regions in the respective drawings.

A difference between the present exemplary embodiment and the first exemplary embodiment will be described. In the present exemplary embodiment, a fifth semiconductor region 303 arranged in a first first active region 400A and a fifth semiconductor region 303 arranged in a third first active region 400C are constituted by the same semiconductor region.

Specifically, electric carriers generated in photoelectric conversion units 201 arranged in the first first active region 400A and electric carriers generated in photoelectric conversion units 201 arranged in the third first active region 400C are transferred to the same fifth semiconductor region 303.

A transfer direction of electric carriers in the first first active region 400A is an opposite direction of a transfer direction of electric carriers in the third first active region 400C. However, as long as the first first active region 400A and the third first active region 400C share the fifth semiconductor region 303, the transfer directions are not limited thereto.

Additionally, the fifth semiconductor region 303 according to the exemplary embodiment is electrically connected to a gate electrode 309 of an amplification transistor 205 in a third third active region 401C via a conductor. In other words, a single third active region 401 is configured as being shared by two first active regions, namely, the first active region 400A and the first active region 400C.

Here, the two first active regions 400 have the same fifth semiconductor region 303. However, the configuration is not limited thereto and a larger number of the first active regions 400 may have the same fifth semiconductor region 303.

(Variation)

Figure 7:
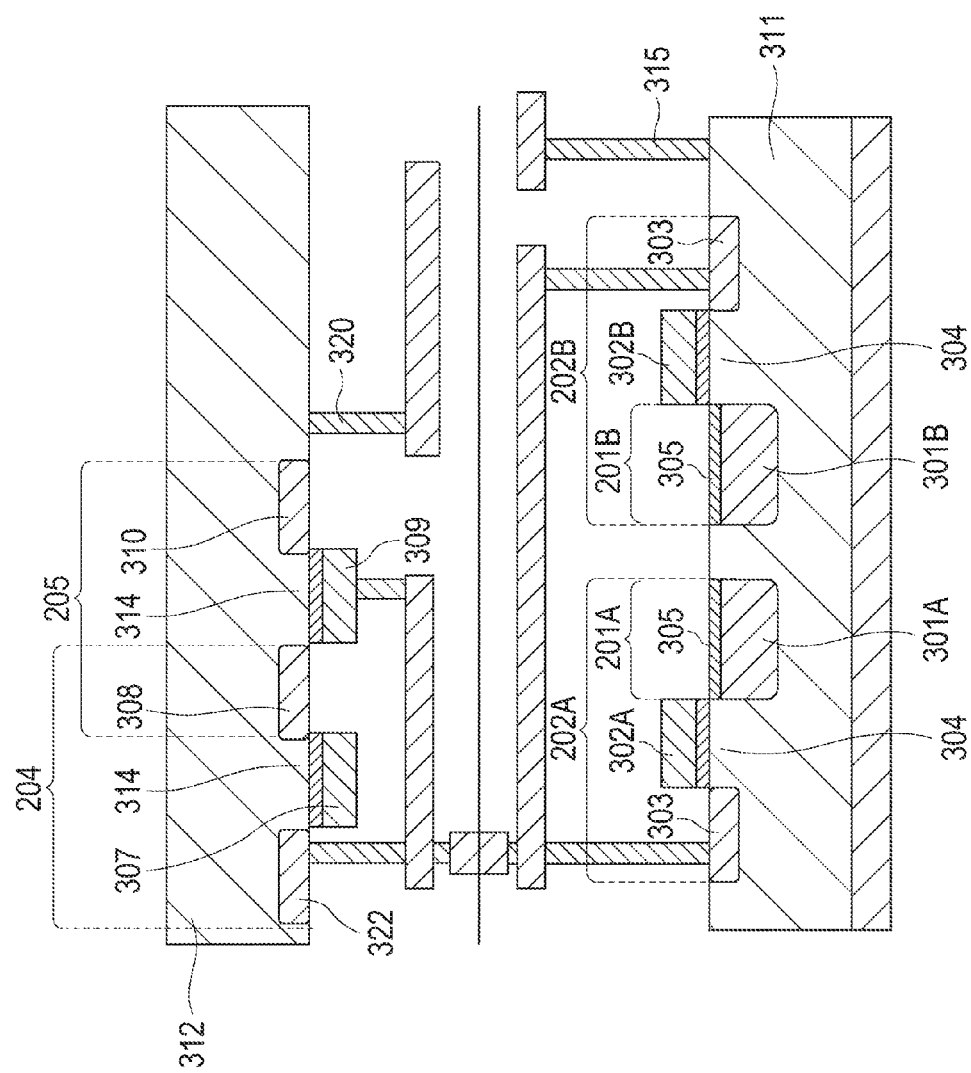
FIG. 7 is a schematic cross-sectional view illustrating a first active region.

FIG. 7 illustrates a schematic cross-sectional view for explaining a characteristic of an image pickup apparatus according to a variation. Description of members having similar functions as those in FIGS. 1 to 6 will be omitted.

The variation is different from the first embodiment in that a semiconductor region serving as the channel region for transfer transistors is constituted by a different semiconductor region from a semiconductor region serving as the channel region for an amplification transistor.

In FIG. 7, the semiconductor region serving as the channel region for the amplification transistor 205 is a semiconductor region 312. The semiconductor region 312 may be an N-type semiconductor region, or alternatively, a P-type semiconductor region. In FIG. 7, a P-type semiconductor region 311 and the semiconductor region 312 are arranged on different semiconductor substrates to be configured as separate semiconductor regions. Note that, in a case where the P-type semiconductor region 311 and the semiconductor region 312 are arranged on the same semiconductor substrate, the P-type semiconductor region 311 and the semiconductor region 312 may be configured as separate semiconductor regions by using an insulator isolation portion or the like. Alternatively, the semiconductor region 312 can be changed to the N-type such that the P-type semiconductor region 311 and the semiconductor region 312 are configured as separate semiconductor regions.

The reference voltage is supplied to the P-type semiconductor region 311 from a contact plug 315 (first contact plug), whereas the reference voltage is supplied to the semiconductor region 312 from a contact plug 320 (second contact plug). The contact plug 315 and the contact plug 320 are separate contact plugs. In addition, the reference voltages supplied to these contact plugs may be the same reference voltage, or alternatively, different reference voltages. For example, when the semiconductor region 312 is of the P-type, ground potentials can be supplied to the contact plugs 315 and 320. When the semiconductor region 312 is of the N-type, the ground potential is supplied to the contact plug 315, while a power supply voltage, specifically, a positive electric potential relative to the ground potential such as 3.3 V can be supplied to the contact plug 320. In a case where the semiconductor region 312 is of the N-type, the amplification transistor is configured as a P-type transistor. In other words, the amplification transistor is configured as a transistor of a conductivity type opposite to that of the transfer transistors.

Furthermore, the reference voltages are supplied to the contact plugs 315 and 320 via wires different from each other. Accordingly, changes in the reference voltage supplied to the contact plug 315 do not easily vary the voltage in the semiconductor region 312 serving as a channel of the amplification transistor 205. In such a configuration, the transfer transistors are mainly affected by variations in the reference voltage applied to the contact plug 315. Operation of the transfer transistors is affected during a period from a start to an end of the accumulation period of electric carriers. For this reason, the present variation simply locates, at a position separated from the contact plug 315 by a longer distance, a gate electrode of one of the transfer transistors with a larger number of times the on-state voltage is supplied to the gate electrode thereof during the accumulation period of electric carriers.

Figure 4:
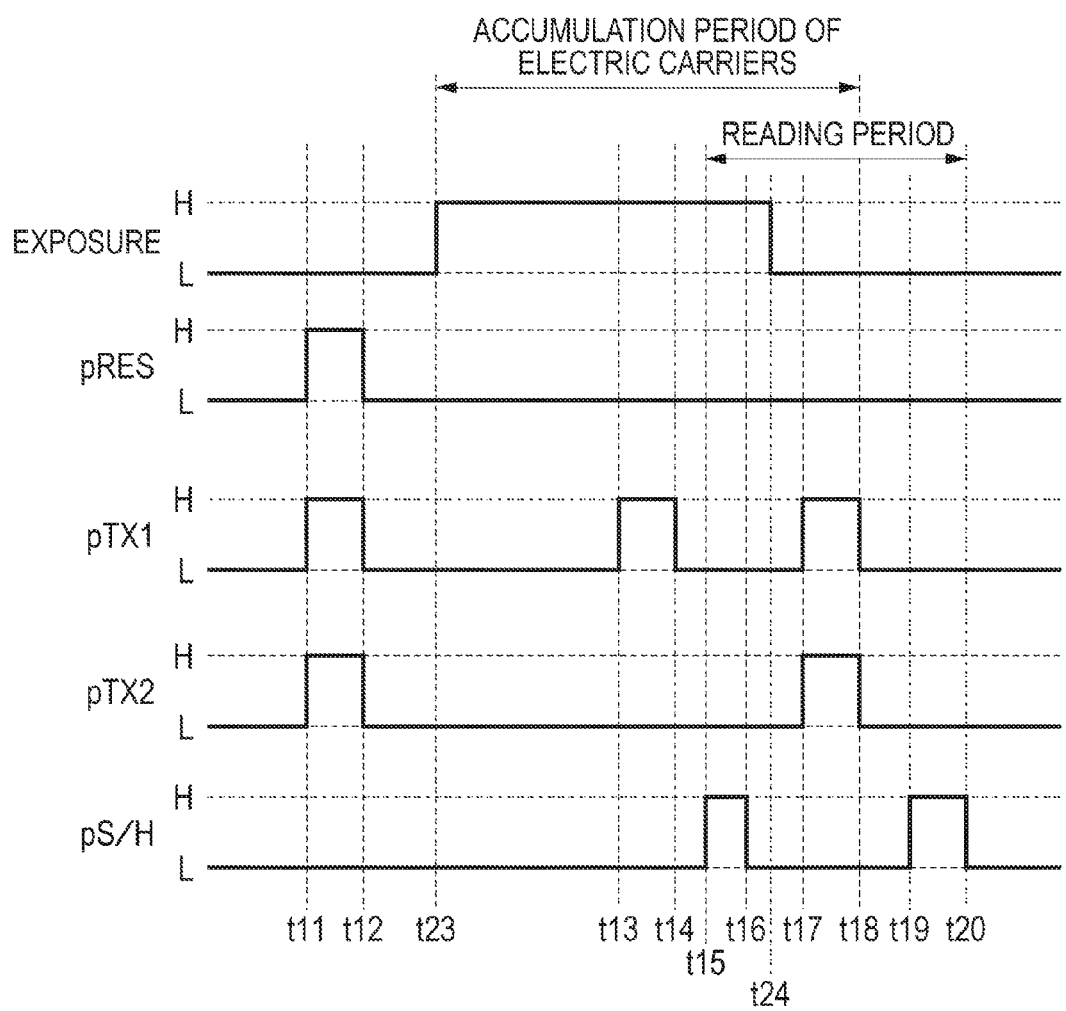
FIG. 4 is a diagram illustrating a driving timing.

It is clear from FIGS. 3 and 4 that a first transfer transistor 202A is supplied with the on-state voltage a larger number of times during the accumulation period of electric carriers. Accordingly, as in the first embodiment, by arranging the contact plug 315 and the gate electrodes of the transfer transistors as illustrated in FIG. 5 in the present variation as well, deterioration in the image quality due to changes in the voltage applied to the semiconductor region serving as the channel region for the transfer transistors can be suppressed.

The invention has been described thus far using the specific exemplary embodiments. However, the exemplary embodiments can be combined with each other and modified as necessary without departing from the scope and spirit of the invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-076378, filed Apr. 2, 2015, which is hereby incorporated by reference herein in its entirety.

What is claimed is:

1. An image pickup apparatus comprising:
   a plurality of pixels each having a first photoelectric conversion unit and a second photoelectric conversion unit, a floating diffusion, a first transfer transistor configured to transfer electric carriers from the first photoelectric conversion unit to the floating diffusion, a second transfer transistor configured to transfer electric carriers from the second photoelectric conversion unit to the floating diffusion, and an amplification transistor configured to amplify signals based on the electric carriers transferred to the floating diffusion; and
   a contact plug configured to supply a reference voltage to a semiconductor region serving as a channel region for the first transfer transistor, the second transfer transistor, and the amplification transistor, wherein
   during a period from a start of an accumulation period of electric carriers for the first photoelectric conversion unit and the second photoelectric conversion unit to an end of a reading period for which signals based on the electric carriers generated in the accumulation period of electric carriers are read to the outside of the pixel, a number of times an on-state voltage is supplied to a gate electrode of the first transfer transistor is larger than a number of times an on-state voltage is supplied to a gate electrode of the second transfer transistor, and
   among the plurality of pixels, in a pixel having a shortest distance from the gate electrode of the second transfer transistor to the contact plug, a distance from the gate electrode of the second transfer transistor to the contact plug is shorter than a distance from the gate electrode of the first transfer transistor to the contact plug.

2. The image pickup apparatus according to claim 1 further comprising:
   the plurality of pixels each having the shortest distance from the gate electrode of the second transfer transistor to the contact plug.

3. An image pickup apparatus comprising:
   a plurality of pixels each having a first photoelectric conversion unit and a second photoelectric conversion unit, a floating diffusion, a first transfer transistor configured to transfer electric carriers from the first photoelectric conversion unit to the floating diffusion, a second transfer transistor configured to transfer electric carriers from the second photoelectric conversion unit to the floating diffusion, and an amplification transistor configured to amplify signals based on the electric carriers transferred to the floating diffusion;

first-conductivity type first semiconductor regions serving as channel regions for the first transfer transistor and the second transfer transistor and a first-conductivity type second semiconductor region serving as the channel region for the amplification transistor; and a contact plug configured to supply a reference voltage to the first semiconductor regions and the second semiconductor region, wherein during a period from a start of an accumulation period of electric carriers for the first photoelectric conversion unit and the second photoelectric conversion unit, to an end of a reading period for which signals based on the electric carriers generated in the accumulation period of electric carriers are read to the outside of the pixel, a number of times an on-state voltage is supplied to a gate electrode of the first transfer transistor is larger than a number of times an on-state voltage is supplied to a gate electrode of the second transfer transistor, and the image pickup apparatus further comprises a plurality of first active regions each having a second-conductivity type third semiconductor region partially constituting the first photoelectric conversion unit and accumulating the electric carriers generated in the first photoelectric conversion unit, a second-conductivity type fourth semiconductor region partially constituting the second photoelectric conversion unit and accumulating the electric carriers generated in the second photoelectric conversion unit, and a second-conductivity type fifth semiconductor region constituting the floating diffusion, wherein the contact plug is arranged in at least one of a first first active region and a second first active region adjacent to the first first active region among the plurality of first active regions, or arranged in a second active region arranged between the first first active region and the second first active region, and a distance from the contact plug to the gate electrode of the second transfer transistor arranged on the first first active region is shorter than distances from the contact plug to the respective gate electrodes of the first transfer transistors arranged on the first first active region and the second first active region, and at the same time, is equal to or shorter than a distance from the contact plug to the gate electrode of the second transfer transistor arranged on the second first active region.

4. The image pickup apparatus according to claim 3, wherein the pixel includes the amplification transistor configured to read signals based on the electric carriers transferred to the floating diffusion, and the amplification transistor is arranged in a third active region which faces the first first active region across an element isolation portion.

5. The image pickup apparatus according to claim 4, wherein the first first active region and the third active region are arranged side by side along a direction perpendicular to a transfer direction of electric carriers from the third semiconductor region and the fourth semiconductor region to the fifth semiconductor region, and the contact plug is arranged in a region between the first first active region and the third active region.

6. The image pickup apparatus according to claim 4, wherein the first and second photoelectric conversion units of the plurality of pixels are arranged in a matrix form, and the amplification transistor that reads signals based on the electric carriers generated in the first and second photoelectric conversion units of the pixel in a first row is arranged in the third active region arranged between the first active regions in which the first and second photoelectric conversion units of the pixels in a second row are arranged.

7. The image pickup apparatus according to claim 6, wherein the fifth semiconductor region to which the electric carriers from the first and second photoelectric conversion units of the pixel in the first row are transferred, and the fifth semiconductor region to which the electric carriers from the first and second photoelectric conversion units of the pixel in the second row are transferred are the same semiconductor region.

8. The image pickup apparatus according to claim 4, wherein the contact plugs are arranged in at least some of the first active regions among the plurality of first active regions when viewed from above.

9. The image pickup apparatus according to claim 4, wherein the first active region and the third active region are arranged side by side along a direction perpendicular to a transfer direction of electric carriers from the third semiconductor region and the fourth semiconductor region to the fifth semiconductor region, and the third active region and the contact plug are arranged side by side along a transfer direction of electric carriers from the third semiconductor region and the fourth semiconductor region to the fifth semiconductor region when viewed from above.

10. The image pickup apparatus according to claim 1, wherein the contact plug is provided in plurality and the plurality of contact plugs is arranged in a zigzag form.

11. The image pickup apparatus according to claim 1, wherein the contact plug is provided in plurality and a number of the plurality of contact plugs is equal to a number of the pixels.

12. The image pickup apparatus according to claim 1, wherein the contact plug is provided in plurality and a number of the plurality of contact plugs is smaller than a number of the pixels.

13. The image pickup apparatus according to claim 1, wherein the on-state voltage is supplied to the gate electrode of the first transfer transistor while an off-state voltage is supplied to the gate electrode of the second transfer transistor, and subsequently, the on-state voltage is simultaneously supplied to the gate electrode of the first transfer transistor and the gate electrode of the second transfer transistor.

14. The image pickup apparatus according to claim 4, wherein the contact plug is provided in plurality and the plurality of contact plugs are arranged in a zigzag form.

15. The image pickup apparatus according to claim 4, wherein
the contact plug is provided in plurality and a number of the plurality of contact plugs is equal to the number of the pixels.

16. The image pickup apparatus according to claim 4, wherein
the contact plug is provided in plurality and a number of the plurality of contact plugs is smaller than the number of the pixels.

17. The image pickup apparatus according to claim 4, wherein
the on-state voltage is supplied to the gate electrode of the first transfer transistor while an off-state voltage is supplied to the gate electrode of the second transfer transistor, and subsequently,
the on-state voltage is simultaneously supplied to the gate electrode of the first transfer transistor and the gate electrode of the second transfer transistor.

18. The image pickup apparatus according to claim 1, wherein the first photoelectric conversion unit having a first semiconductor region accumulating the electric carriers and the second photoelectric conversion unit having a second semiconductor region accumulating the electric carriers are arranged on each of a plurality of first active regions, and the contact plug is arranged at least one of the plurality of first active regions.

19. The image pickup apparatus according to claim 18, wherein the contact plug is arranged closer to the second semiconductor region than the first semiconductor region.

20. The image pickup apparatus according to claim 19, wherein the second semiconductor region is arranged between the gate electrode of the second transfer transistor and the contact plug.

* * * * *